United States Patent [19]
Vitins

[11] 3,983,377
[45] Sept. 28, 1976

[54] METHOD AND APPARATUS FOR DETECTING A FAULT LOCATION AT AN ELECTRICAL CONDUCTOR

[75] Inventor: Michael Vitins, Zurich, Switzerland

[73] Assignee: BBC Brown Boveri & Company Limited, Baden, Switzerland

[22] Filed: June 30, 1975

[21] Appl. No.: 591,343

[30] Foreign Application Priority Data
July 8, 1974 Switzerland.................... 9361/74

[52] U.S. Cl.............................. 235/151.31; 324/52; 324/73 PC
[51] Int. Cl.².................... G01R 31/08; G06G 7/12
[58] Field of Search..... 235/151.31, 151.3, 153 AK; 324/51, 52, 73 R, 73 AT, 73 PC

[56] References Cited
UNITED STATES PATENTS

| | | | |
|---|---|---|---|
| 3,735,248 | 5/1973 | Reese................................ | 324/52 X |
| 3,777,129 | 12/1973 | Mehia.............................. | 235/151.3 |
| 3,812,420 | 5/1974 | Gunter................................ | 324/52 |
| 3,831,160 | 8/1974 | Cronin et al...................... | 324/51 X |

*Primary Examiner*—Edward J. Wise
*Attorney, Agent, or Firm*—Werner W. Kleeman

[57] ABSTRACT

A method of, and apparatus for, detecting a fault location at an electrical conductor which entails forming a wave voltage and therefrom together with a measurement voltage a first wave function and a second wave function. Weighted functions are formed by multiplication of the first and second wave functions with a substantially cosine-type and sine-type signal, respectively, of a predetermined reference frequency. Integral functions are formed from the weighted functions. There is formed the product difference from those integral functions produced by cosine and sine weighting, respectively, of the first and second wave functions and integration, and/or the product sum from those integral functions formed by cosine weighting of the first and second wave functions or sine weighting of the first and second wave functions, respectively, and there is checked the sign of at least one of such product polynomials.

18 Claims, 6 Drawing Figures

METHOD AND APPARATUS FOR DETECTING A FAULT LOCATION AT AN ELECTRICAL CONDUCTOR

BACKGROUND OF THE INVENTION

The present invention relates to a new and improved method of, and apparatus for, detecting a fault location at an electrical conductor or line from measurement voltages and measurement currents received at a measurement location following an error-indicating excitation signal. This invention also relates to a new and improved construction of apparatus for the preformance of the aforesaid method.

One such localized determination of defects or faults appearing at electrical conductors or lines — what is generally detected are short-circuits and potential drop faults possessing low to negligible residual voltage at the defect location — is generally performed with the aid of distance relays. In this regard there are utilized electromechanical or even at the present time electronic analog computer elements, the proper functionality of which requires essentially sinusoidal measurement signals or input signals. However, these measurement signals are only available at the measurement location or station after a certain time following the occurrence of the fault or the arrival of the fault signal, because the transient signals triggered by a short-circuit initially extremely distort the fundamental operating frequency of the conductor and decay comparatively slowly. Therefore it is necessary to resort to either an appropriate time-delay until deriving valid distance results, or to resort to the use of frequency filters which permit of an earlier evaluation of the fundamental frequency components. Both techniques are basically disadvantageous, and specifically, on the one hand owing to the desired rapid control of the protective switch arranged after the distance relay and, on the other hand, because of undesired inertia-prone transition functions of the filter which once again result in a time-delay and, under certain circumstances, can also even have an undesired affect upon the functionality of the relay.

It is therefore desirable to have a fault location-detection which is already functional during the compensation operations following the appearance of the short-circuit and does not require any time-delay interval until the start of its functional operation and as concerns such functional operation only requires as short as possible period of time.

In this connection there are already known to the art fault location-detecting techniques which operate with travelling waves. There is specially generated a test signal possessing a steep wave front which is applied to the conductor or line to be monitored. The re-appearance of the wave reflected by the fault or defect location back to the transmitting or measurement location and the duration of the time interval required for the travel of the test signal to the fault location and back again to the measurement location in conjunction with the known speed of travel of the wave at the conductor determines the distance between the fault location and the measurement location.

What is disadvantageous with this state-of-the-art technique, apart from the need for a special transmitter, is the sensitivity of the system to disturbance signals as such particularly appear with considerable intensity at power current lines and especially high-voltage lines with steep wave flanks. This sensitivity is predicted upon the fact that the detection method basically relies upon a signal flank detection which is based upon a time differential measurement technique. Moreover, the measurement operation becomes critical when the measurement location is situated very near to the fault locations owing to the extremely small travel times.

SUMMARY OF THE INVENTION

It is therefore a primary object of the present invention to provide a new and improved method of, and apparatus for, detecting defect or fault locations at electrical conductors or lines with lesser response delays and equally with a small expenditure in time for the determination of the fault location and with high security against disturbance signals.

Now in order to implement these and still further objects of the invention, which will become more readily apparent as the description proceeds, the method aspects of the invention are manifested by the features that:

a. there is formed a wave voltage ($u_w$) by multiplying a measurement current ($i_m$) with the wave resistance or characteristic impedance ($R_w$) of the conductor;

b. there is formed a first wave function ($a$) by adding the wave voltage ($u_w$) to the measurement voltage ($u_m$) and a second wave function ($b$) by subtracting the wave voltage (i $u_w$) from the measurement voltage ($u_m$);

c. there are formed weighting or weighted functions ($G_{a1}$, $G_{a2}$, $G_{b1}$, $G_{b2}$) by multiplication of the first wave function ($a$) and the second wave function ($b$) with a substantially cosine-type and substantially sine-type signal, respectively, of a predetermined reference frequency ($\omega$);

d. there is formed a respective first to fourth integral function ($A_1$, $A_2$, $B_1$, $B_2$) by the integration as a function of time of a respective one of the weighted functions ($G_{a1}$, $G_{a2}$, $G_{b1}$, $G_{b2}$) over an integration interval (T) of substantially given duration, which begins following the error-indicating excitation and possesses a time-shift (T') for the weighted functions obtained from the second wave function ($b$) with respect to the weighted functions obtained from the first wave function ($a$) which corresponds to an integral multiple of the wave travel time between the measurement location ($x=O$) and a predetermined reference location ($x=Z_R$), and there is performed either a time-shift ($-\omega T'$) corresponding to the product of the integration interval shift and the reference frequency in a sense opposite to the latter for the cosine and sine signals within the weighted functions obtained from the second wave function ($b$), or without such a time-shift there is performed a linear combination of the integral functions obtained from the second wave function ($b$) with cosine and sine values of an angle argument corresponding to the product of the integration time-shift and the reference frequency ($\omega$); and e. there is formed the product difference from those integral functions ($A_1 \cdot B_2$ or $A_2 \cdot B_1$) produced by cosine and sine weighting, respectively, of the first and second wave functions. and integration, and/or the product sum from those integral functions ($A_1 \cdot B_1$ or $A_2 \cdot B_2$), formed by cosine weighting of the first and second wave functions or sine weighting of the first and second wave functions, respectively, and checking the sign of at least one of such product polynomials.

The apparatus for the preformance of the aforesaid method aspects comprises:

a. an excitation circuit having an error-indicating excitation signal as the output;
b. measurement elements for the measurement of a measurement voltage ($u_m$) and a measurement current ($i_m$) at a predetermined measurement location ($x=0$);
c. a multiplier in circuit following the current measuring element for forming a product from the wave resistance ro characteristic impedance ($R_w$) of the conductor and the measurement current ($i_m$);
d. an addition and substration circuit having two outputs, the first of which has associated therewith a first wave function ($a=u_m=R_w \cdot i_m$) and the second of which has associated therewith a second wave function ($b=u_m-R_w \cdot i_m$);
e. a multiplier device having inputs for at least one signal which is sinusoidal as a function of time and for the first and second wave functions ($a,b$) and having outputs with which there are associated the four weighted functions ($G_{a1}, G_{a2}, G_{b1}, G_{b2}$) in the form of the products of the first and second wave functions ($a,b$) with in each case two complementary sinusoidal signals;
f. an integration device having inputs for the four weighting functions ($G_{a1}, G_{a2}, G_{b1}, G_{b2}$);
g. a switching device for determining the duration coinciding with the integration intervals (T) for said four weighted functions as the integrand;
h. said integration device having four integral outputs, each of which has associated therewith one of four integral functions ($A_1, A_2, B_1, B_2$), each of which is associated with the time integral of one of the weighted functions;
i. a multiplication and subtraction device for forming an evaluation function of the form $A_1 \cdot B_2 - B_2 \cdot B_1$ from the four integral functions ($A_1, A_2, B_1, B_2$); and
j. a subsequently connected sign testing circuit with an output associated with the position direction of the fault location with respect to the reference location.

The solution of the problem is based upon the concept that the course of the current and voltage as a function of time at the fault location, i.e., the short circuit current and the short circuit- and arc-voltage which disappears and is small in relation to the operating voltages and that of the current and voltage at a further conductor point, especially at the measurement location, in each instance has clearly associated therewith a given pair of oppositely directed current/voltage waves, provided there are eliminated certain periodic ambiguities with respect to the spacing between the measurement location and the fault location, something readily possible in practice.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE INVENTION

Figure 1:
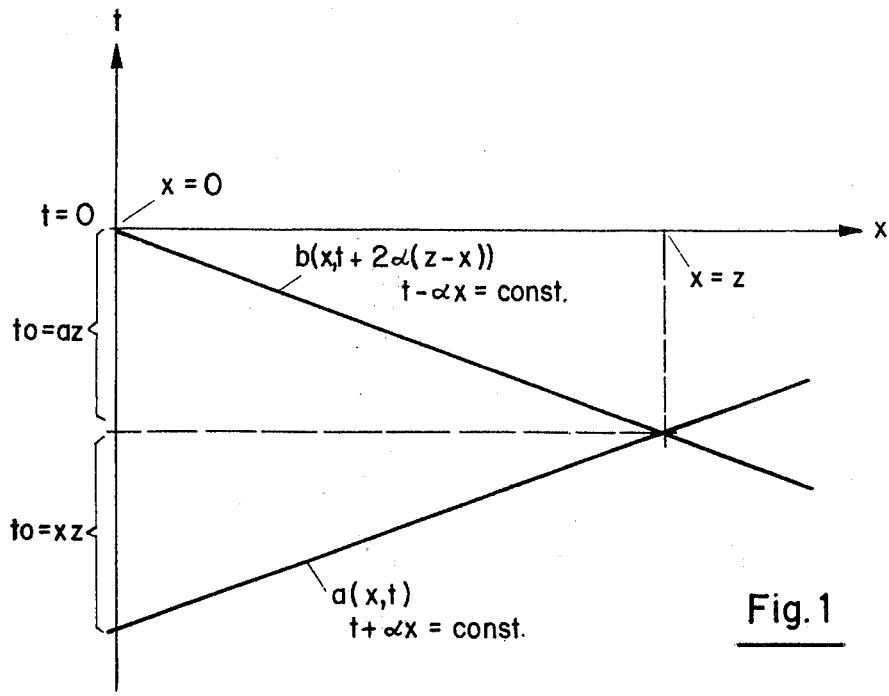
FIG. 1 is a schematic diagram serving to explain certain of the principles of the invention in conjunction with a conductor section which is to be supervised for the detection of a fault location.
Figure 2:
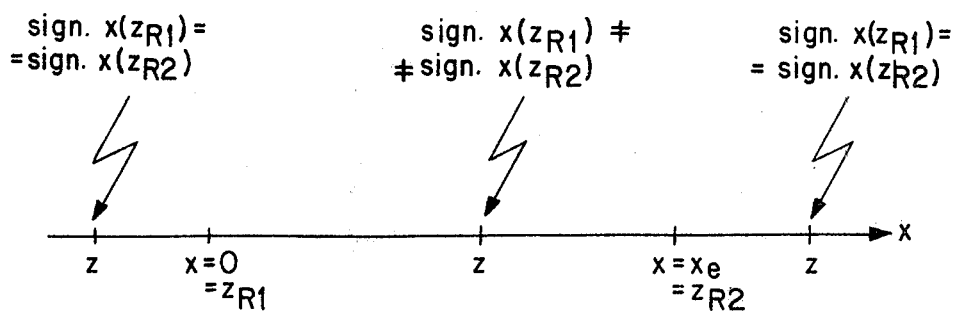
FIG. 2 schematically illustrates a conductor section at which appear at a number of locations faults and serving to explain the invention.

In the description to follow there will be initially considered the basic principles of operation of the invention, assuming a short-circuit voltage at the fault location equal to null and a loss-free conductor with real wave resistance. In order to be able to make use of the wave equations, according to the showing of FIG. 1, there is plotted a conductor coordinate $x$ for the traveling waves. There is specifically plotted the measurement location $x = 0$ constituting the start and $x = x_e$ the end of a conductor section to be monitored and a basically random predeterminable reference location $x = z_R$ which, as a practical matter however, lies within the conductor or line section (including $x = 0$) and $x = x_e$) to be monitored. The fault or defect location $x = z$ which is to be ascertained, for instance to be localized at a position falling within or without the aforementioned conductor section, according to the prevailing assumptions possesses the characteristic that at the time $t$ there is identically true the following:

Equation (1)

$$u(z,t) = 0 \text{ and } i(z,t) = i_L(t),$$

wherein the symbol $u$ represents the conductor voltage $u$, the symbol $i$ the conductor current i, and the symbol $i_L$ the short-circuit current $i_L$ at the fault location.

By means of a "wave voltage" $u_w = R_w \cdot i(x,t)$ introduced for the sake of simplicity and the real wave resistance $R_w$, there now can be defined a first wave function $a(x,t)$ and a second wave function $b(x,t)$ by the following:

Equation (2)

$$a(x,t) = u(x,t) + u_w(x,t) \text{ and } b(x,t) = u(x,t) - u_w(x,t)$$

The solutions of the known wave equations:

Equation (3)

$$\frac{du(x,t)}{dx} + L' \cdot \frac{di(x,t)}{dt} = 0, \quad \frac{di(x,t)}{dx} + C' \cdot \frac{du(x,t)}{dt} = 0$$

with the inductance $L'$ per unit length and the capacitance $C'$ per unit length for the boundary conditions according to Equation (1) with uniform wave travel time $\alpha = \sqrt{L'.C'}$ and after substitution in the wave function Equations (2) results in the following:

Equation (4)

$$a(x,t) = R_w i_L(t+\alpha(z-x)), \; b(x,t) = -R_w i_L(t-\alpha(z-x))$$

The first wave function thus constitutes a voltage wave moving towards the right, the second wave function a voltage wave moving towards the left, and the latter, while taking into account the sign, can be conceptually considered as the wave of the first wave function traveling towards the right which is reflected at the fault location.

For the fault location $x = z$ there is correspondingly plausible:

Equations (5)

$$a(z,t) + b(z,t) = 0 \text{ and } u(z,t) = 0$$

A coordinate shift as a function of time for the second wave function results in the following function which is valid for the entire length of the conductor:

Equation (6)

$$b(x,t\pm 2\alpha(z-x)) + a(x,t) = 0$$

and from such there can be derived for the measurement location $x = 0$:

Equation (7)

$$b(0,t\pm 2\alpha z) + a(0,t) = 0,$$

i.e., a definitive equation for the fault location $z$ which is to be found, because in this case both of the wave functions only appear at the location $x = 0$. At the measurement location, there is thus valid:

Equations (8)

$$a(0,t) = u_m(t) + R_w i_m(t) \text{ and } b(0,t) = u_m(t) - R_w i_m(t)$$

with the measurement voltage $u_m(t)$ and the measurement current $i_m(t)$, so that the substitution of the wave functions in Equation (7) by the expressions of Equation (8) produces a relationship which, apart from the fault location $z$ which is to be found, only contains time functions which can be measured.

This definitive equation of course is not easily resolvable as a function of the fault location $z$, because the latter appears in the argument of the time measurement functions. The mathematical solution thus makes use of the Fourier transformation in the following manner:

Without considering the practical feasibility, it is initially assumed that the short-circuit condition is satisfied for a randomly long period of time and the integration of the Fourier transformation is not bound by any time limits. There can be conceived a first complex integral function, to wit:

Equation (9)

$$A'(\omega) = A_1' - jA_2' = 1/T \int_{-\infty}^{\infty} e^{-j\omega t} a(0,t) dt$$

and a second complex integral function, to wit:

Equation (10)

$$B'(\omega,z_R) = B_1' - jB_2' = 1/T \int_{-\infty}^{\infty} e^{-j\omega t} b(0,t+2\alpha z_R) dt$$

wherein, the symbol $\omega$ represents an initially freely selectable reference frequency and the symbol $z_R$ represents the x-coordinate of a likewise freely selectable reference location.

With a time transformation according to:

Equation (11)

$$t = \tau - 2\alpha(z-z_R)$$

while taking into account Equation (7) there results:

Equation (12)

$$b'(\omega,z) = -A'(\omega)$$

and

Equation (13)

$$e^{2j\omega \alpha (z-z_R)} = -A'(\omega)/B'(\omega,z_R)$$

or

Equation (14)

$$2\omega\alpha(z-z_R) = \text{imaginary part } ( \ln(-A'(\omega)/B'(\omega,z_R)))$$

or

Equation (15)

$$z = z_R + \frac{1}{2\omega\alpha} \cdot \arctan \left( \frac{A_1'B_2' - A_2'B_1'}{A_1'B_2' + A_2'B_2'} \right),$$

and ambiguities due to the periodicity of the arctan-function with $\pi$ can be eliminated by limiting the reference frequency according to the function:

Equation (16)

$$\omega < \frac{\pi}{4\alpha x_e}$$

with the end coordinate $x_e$ of the conductor section to be monitored.

A more precise examination, which has not herein been disclosed in detail, demonstrates that the previously assumed infinite integration interval can be replaced in the following manner practically by a finite integration interval T beginning at $t = 0$, wherein $t = 0$ represents the point in time of the appearance of the short-circuit wave condition at the measurement location $x = 0$, and, as indicated in FIG. 1, the short-circuit thus must have at least previously arisen at the time $t_o = \alpha z$. This can be readily insured for in practice by means of a suitable basically conventional and therefore not further discussed fault-or error indicating excitation. Owing to the finite integration interval there appears an error term $\epsilon$ which is additive with respect to $z$ and possessing an upper boundary and can be expressed as follows:

Equation (17)

$$\epsilon < \frac{T_{min}}{T} \cdot \frac{1}{\sqrt{1 - \left(\frac{T_{min}}{T}\right)^2}} \cdot \frac{1}{2\alpha\omega}$$

In the foregoing function the value $T_{min}$ constitutes a lower boundary of the integration time or duration T, and in order to maintain small the additive error term $\epsilon$ the quotient $T_{min}/T$ should lie considerably below the value of 1. For the value $T_{min}$ there is valid the following relation:

Equation (18)

$$T_{min} = 4 \frac{b_{max} \cdot \alpha |z - z_R|}{\sqrt{B_1^2 + B_2^2}}$$

wherein $b_{max}$ constitutes the absolute maximum of $b(0,t)$. The actual dimensioning of the integration time can be readily brought into accord with the requirement $T > T_{min}$ by orientation measurements or estimations of the value of $b_{max}$, $B_1$ and $B_2$. The magnitudes $B_1$ and $B_2$, which will be discussed more fully hereinafter, constitute the real- and imaginary part, respectively, of the integral function B corresponding to Equation (10), however with finite integration time.

For the practical evaluation there now is formed from the measurement magnitudes $u_m$ and $i_m$ the wave functions $a(0, t)$ and $b(0,t)$ and multiplied by weighted trigonometric function-signals $\cos(\omega t)$ and $\sin(\omega t)$ of the already introduced reference frequency $\omega$, and specifically, for $a(0, t)$ and $b(0,t)$ with two different timewise relative positions of the wave function with respect to the relevant trigonometric function corresponding to a time shift $T'$ between these relative positions. The value $T'$ is adjusted to an integral multiple, generally to twice the wave travel time $\alpha z_R$ between the reference location and the measurement location. Hence, there result the weighted or weighting functions:

Equations (19)

$G_{a1} = \cos(\omega t) \cdot a(0,t)$,
$G_{a2} = \sin(\omega t) \cdot a(0,t)$, $G_{b1} = \cos(\omega t - \omega T') \cdot b(0,t)$,
$G_{b2} = \sin(\omega t - \omega T') \cdot b(0,t)$ Thus, by integration over the interval T with appropriate opposite shifting of this interval by the value $T'$ for the functions $G_{b1}$ and $G_{b2}$ there are formed the following integral functions:

Equations (20)

$$A_1(\omega) = 1/T \cdot \int_0^T G_{a1} \, dt,$$

$$A_2(\omega) = 1/T \cdot \int_0^T G_{a2} \, dt,$$

$$B_1(\omega, z_r) = 1/T \cdot \int_{T'}^{T + T'} G_{b1} \, dt ,$$

-continued $$B_2(\omega, z_R) = 1/T \cdot \int_{T'}^{T + T'} G_{b2} \, dt .$$

The values $A_1$, $A_2$, $B_1$, $B_2$ can be considered as the respective real- and imaginary parts of two complex integral functions:

Equations (21)

$A = A_1 - jA_2, B = B_1 - jB_2$ which for the condition $T >> T_{min}$ as approximation for $A'$ and $B'$ respectively, can be evaluated by means of the Equations (14) or (15). The division by the value T in Equations (20) is carried out by simple standardization, because this integration interval is of the same duration for all integral functions.

What is important for the localization of the defect or fault according to the present invention is the relative shifting or displacement of the integration interval between, on the one hand, $G_{a1}$, $G_{a2}$ and, on the other hand $G_{b1}$, $G_{b2}$ through the value $T'$ in conjunction with a corresponding opposed time manipulation with respect to the weighted trigonometric functions, namely either a relative displacement of the latter between $G_{a1}$, $G_{a2}$ on the one hand and $G_{b1}$, $G_{b2}$ on the other hand by the time duration $T'$ or the angle $\omega T'$ according to Equation (19) or, as follows, with a linear combination of integral functions which are formed with the same timewise relative position of the trigonometric functions and the wave functions for all integrations, and certain fixed coefficients in the form of trigonometric functions of an appropriate argument $\omega T'$:

Instead of the weighted functions $G_{b1}$ annd $G_{b2}$ according to Equation (19) with $\cos(\omega t - \omega T')$ and $\sin(\omega t - \omega T')$, respectively, there are formed weighted functions according to:

Equations (22)

$G_{c1} = \cos(\omega t) \cdot b(0,t)$ and $G_{c2} = \sin(\omega t) \cdot b(0,t)$ and according to Equation (20) integral functions, namely:

Equations (22a)

$$C_1 = 1/T \cdot \int_{T'}^{T + T'} G_{c1} \, dt \text{ and } C_2 = 1/T \cdot \int_{T'}^{T + T'} G_{c2} \, dt$$

Thus, there are formed the following linear combinations:

Equations (23)

$B_1 = \cos(\omega T')C_1 + \sin(\omega T')C_2$, $B_2 = -\sin(\omega T')C_1 + \cos(\omega T')C_2$ Hence, there are again formed the values $B_1$ and $B_2$ for use in accordance with Equations (21).

The method variant according to Equations (19) requires only one phase shift instead of the coefficient-multiplier and summation former for solving Equations (23). Both techniques thus have specific advantages which can be decisive for the momentary field of application.

There is yet mentioned still another notation of the values $B_1$ and $B_2$ of Equations (20), to wit:

Equations (23a)

$$B_1 = 1/T \cdot \int_0^T \cos(\omega t) \cdot b(0, t + T') dt$$

$$B_2 = 1/T \cdot \int_0^T \sin(\omega t) \cdot b(0, t + T') dt.$$

It appears as if by means of a positive time-shift in $b(0,t)$ instead of in the argument of the weighted trigonometric functions there can be achieved by means of a negative time-shift equally positioned integration intervals for all integrations. In fact, however, Equations (23a) can not be realized in this form, because the wave function $b(x,t)$ with respect to its course considered from the actual time $t$ to the future is not determinable and therefore unknown. The Equations are therefore first realizable by means of a time transformation which can be expressed as follows:

Equation (23b)

$$t = \tau - T',$$

that is to say, by processing the function value at a time $t$ which lags the actual time $\tau$ by the interval $T'$. Hence, the function $b(0, t + T')$ transforms into the function $b(0, \tau)$, i.e., at the actual time, and $\cos(\omega t)$, $\sin(\omega t)$ transforms into $\cos(\omega t - \omega T')$ and $\sin(\omega t - \omega T')$, respectively, i.e., Equations (23a) transform into Equations (20) for $B_1$, $B_2$, specifically inclusive of the integration limits. Equations (23a) are therefore of the same significance for $B_1$, $B_2$ as Equations (20).

It is still to be mentioned that the relationship of Equation (14) for the determination of the defect or fault location $x=z$ basically corresponds to an examination of the angle argument of the complex magnitude $A'/B'$ or to the approximation $A/B$ which can be realized. Hence, basically also other expressions for such angle argument lead to the desired objective. For instance, in particular there can be used instead of the tangent function expressed by the real and imaginary parts of A and B also the sine function and cosine function approximately in the following form:

Equation (24)

$$\sin(2\omega\alpha(z-z_R)) = (A_2 B_1 - A_1 B_2)/(B_1^2 + B_2^2)$$

or

Equation (25) )) 1

$$\cos(2\omega\alpha(z-z_R)) = -(A_1 B_1 + A_2 B_2)/(B_1^2 + B_2^2)$$

Therefore, there is generally always to be formed a linear combination of the form:

Equation (26)

$$X = A_1 B_2 - A_2 B_1$$

or

Equation (27)

$$Y = A_1 B_1 + A_2 B_2$$

A complete formation of the relevant trigonometric function with the expressions of Equations (26) or (27) as numerator then leads to a quantitative determination of $z$ and $z-z_R$, however for significant practical applications the formation and evaluation of the complete trigonometric functions of the inverse trigonometric deciding of the complex magnitude A/B is not necessary. For decidinng whether a fault location is located to one or the other side of a reference location $x=z$ it is only necessary, for instance, to determine the sign of $z-z_R$, i.e., for instance that of X of Equation (26), because the denominator at the right side of Equations (15) and (24) always has the same sign and the tangent function — just as the sine function — are odd functions which for $z = z_R$ pass through zero or null. The Equation (25), for the same reasons as for such a directional determination, is generally less advantageously usable and also for the quantitative determination of $z$ or $z-z_R$ due to the flat course in the range $z = z_R$.

If there is only performed a directional determination for two different values $z_{R1}$ and $z_{R2}$ of the reference coordinate, then such provides an unequivocal decision regarding the position of a fault or defect location within or externally of a conductor section bounded by both reference locations. Coinciding signs of the value X for both reference locations — sign $X_1$ = sign $X_2$ — means "fault location externally of $z_{R1} z_{R2}$", different signs — sign $X_1 \neq$ sign $X_2$ — means "fault location externally of $z_{R1} z_{R2}$.

A perhaps required determination of the value of $z$ or $z-z_R$ can be attained with the complete Equations (14), (15) and (24), basically also with Equation (25), by analog or also digital solution of the relevant trigonometric function or inverse trigonometric function after there have been calculated the corresponding values of the trigonometric functions from $A_1$, $A_2$, $B_1$, $B_2$ and $C_1$, $C_2$, respectively.

Generally, it is particularly advantageous to select the reference frequency $\omega$ at least approximately in coincidence with a prevailing frequency component in the spectrum of the second wave function, which can be attained with little complicated experimentation and, possibly, with repeated adjustment or setting of $\omega$. Consequently, the correlation between the wave function $b(0,t)$ and the weighted trigonometric functions i.e., also the values $B_1^2 + B_2^2$ of the complex integral function B in the denominator at the right side of Equation (18) become comparatively large and thus $T_{min}$ small. It is thus possible to get by with a smaller integration duration for the same magnitude of the additive error $\epsilon$ according to Equation (17).

Figure 3:
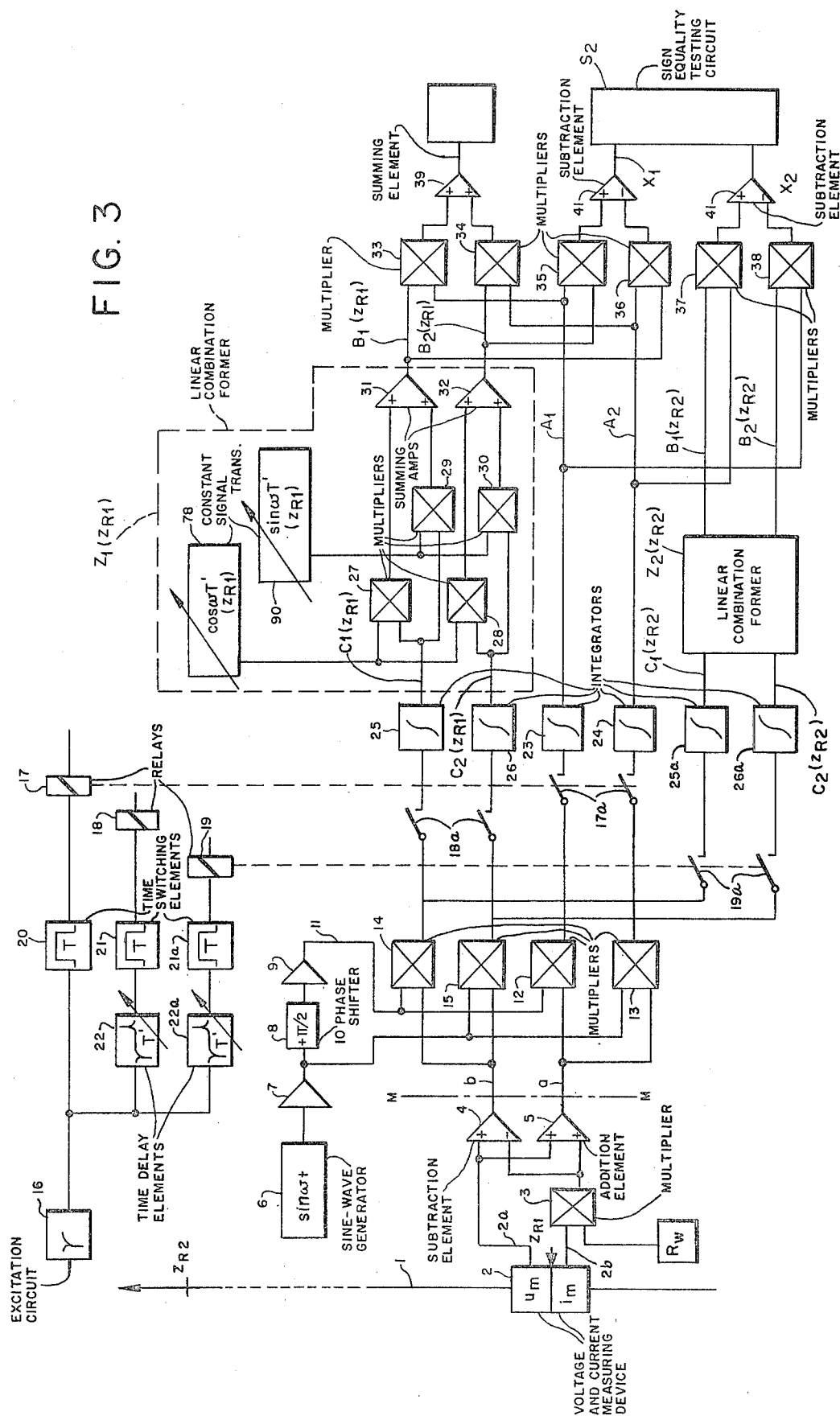
FIG. 3 is an exemplary embodiment of a block circuit diagram of an analog circuit for establishing the location of a conductor fault at a conductor section.

A first exemplary embodiment of an analog circuit for the localization of the fault or defect location at a conductor section between, for instance, $z_{R1}=0$ (the reference location coincides with the start of the conductor and coincides with the measurement location) and $z_{R2}=x_e$ (the reference location coincides with the end of the conductor) has been schematically shown in block circuit diagram in FIG. 3. A voltage and current measuring device 2 located at the measurement location $x=z_{R1}$ of a conductor or line 1 delivers at its outputs 2a and 2b the measurement voltage $u_m$ and the measurement current $i_m$ respectively. The latter is multiplied in a multiplier 3 by the wave resistance or characteristic impedance $R_w$ and delivers the wave voltage $u_w$. A subsequently circuit connected addition or summing amplifier 5 and subtraction amplifier 4 form the wave functions $a$ and $b$. A sinusoidal or sine-wave generator 6 operating at the reference frequency $\omega$ delivers via the amplifiers 7 and 9 as well as a $\pi/2$-phase shift element or phase shifter 8 both of the weighted trigonometric function signals at the outputs 10 and 11, these weighted trigonometric function signals being delivered together with the wave functions $a$ and $b$ to four multipliers 12, 13, 14 and 15 in order to form the weighted or weighting functions $G_{a1}$, $G_{a2}$, $G_{b1}$, $G_{b2}$.

A switching device containing a conventional excitation circuit 16 and relays 17, 18, 19 and associated contacts 17a, 18a, 19a controls the integration of the weighted functions over the integration interval or time T, and specifically by means of synchronized time-switching elements 20 and 21 and for the functions $G_{b1}$ and $G_{b2}$ with an additional switch-in time delay $2\alpha z_{R1}$ by means of a time-delay element 22. There are then electrically connected in the circuit arrangement the integrators 23, 24, 25 and 26 associated with the weighted functions for forming the integral functions $A_1$, $A_2$, $C_1$, $C_2$ and for both of the last-mentioned functions a first multiplier- and addition or summing circuit $Z_1$ embodying the multipliers 27, 28, 29, 30 and the summing or addition amplifiers 31, 32, for the formation of the linear combinations for $B_1$ and $B_2$ from $C_1$ and $C_2$ and the trigonometric function values according to Equations (23) dependent upon the reference location, and specifically for the first value $z_{R1}$ of the reference coordinate. The corresponding coefficients cos ($\omega T'$) and sin ($\omega T'$) with $T'=2\alpha z_{R1}$ are delivered by adjustable constant signal transmitters 79 and 90 respectively. Of course, the last-mentioned transmitters must be adjusted in synchronization with the likewise adjustable time-delay element 22. The components 27 to 32 and 78 and 90 collectively constitute a linear combination former or forming device $Z_1$ for the value $z_{R1}$ having two outputs which have not been particularly referenced and carrying the signals corresponding to $B_1$ ($z_{R1}$) and $B_2$ ($z_{R1}$).

Further at the outputs of the multipliers 14 and 15 there is connected via its own timing circuit composed of the time-delay element 22a, the time-switching element 21a and the relay 19 equipped with the contacts 19a a pair of integrators 25a and 26a and a linear combination former $Z_2$ for the value $z_{R2}$. This linear combination former $Z_2$ is constructed analogous to the linear combination former $Z_1$. Both of the outputs of the linear combination former $Z_2$ carry signals corresponding to $B_1$ ($z_{R2}$) and $B_2$ ($z_{R2}$) for the second value of the reference coordinate.

This circuit construction containing the linear combination formers $Z_1$ and $Z_2$ is of course also suitable for use beyond the scope of the present illustrated example with $z_{R1}=0$ and $z_{R2}=x_e$ for random adjustments of $z_{R1}$ and $z_{R2}$.

As best seen by referring to FIG. 3, the outputs of the linear combination formers $Z_1$ and $Z_2$ and those of the integrators 23 and 24 are connected with three pairs of multipliers 33, 34 and 35, 36 and 37, 38 having connected in circuit thereafter an addition or summing element 39 and the subtraction elements 40 and 41. Thus, there appears at the output of the addition element or amplifier 39 a signal corresponding to the term Y of Equation (27), i.e., the denominator term at the right side of Equation (15), and at the output of the respective subtraction elements or amplifiers 40 and 41 in each instance there appears a signal corresponding to the term $X_1=X(z_{R1})$ and $X_2=X(z_{R2})$ respectively, according to Equation (26), i.e., the numerator term appearing at the right side of Equation (15).

At the output of the addition element 39 there is connected a sign checking or testing circuit $S_1$ which in the case of a positive sign delivers a characteristic signal or suitable indentification character signifying no defect or fault at the relevant conductor section because the aforementioned denominator in the case of a fault is always negative. This characteristic signal is of first rank in relation to the fault-or error-indicating excitation.

At the outputs of the subtraction elements 40 and 41 there is electrically connected a common sign equality testing circuit $S_2$ which, in the event of the presence of the same signs delivers a signal signifying "fault externally of the conductor section $z_{R1}z_{R2}$", and in the case of unequal signs delivers a signal signifying "fault within the conductor section $z_{R1}z_{R2}$".

For the case $z_{R1}=0$ which was initially assumed for this exemplary embodiment the circuit is simplified to the extent that there can be dispensed with the linear combination former or circuit $Z_1$ and the outputs of the integrators 25 and 26 directly deliver the values $C_1=B_1$ and $C_2=B_2$ respectively. Equally there can be dispensed with the timing circuit branch 18, 21, 22 so that the contacts 18a can be coactuated by the relay 17.

Figure 4:
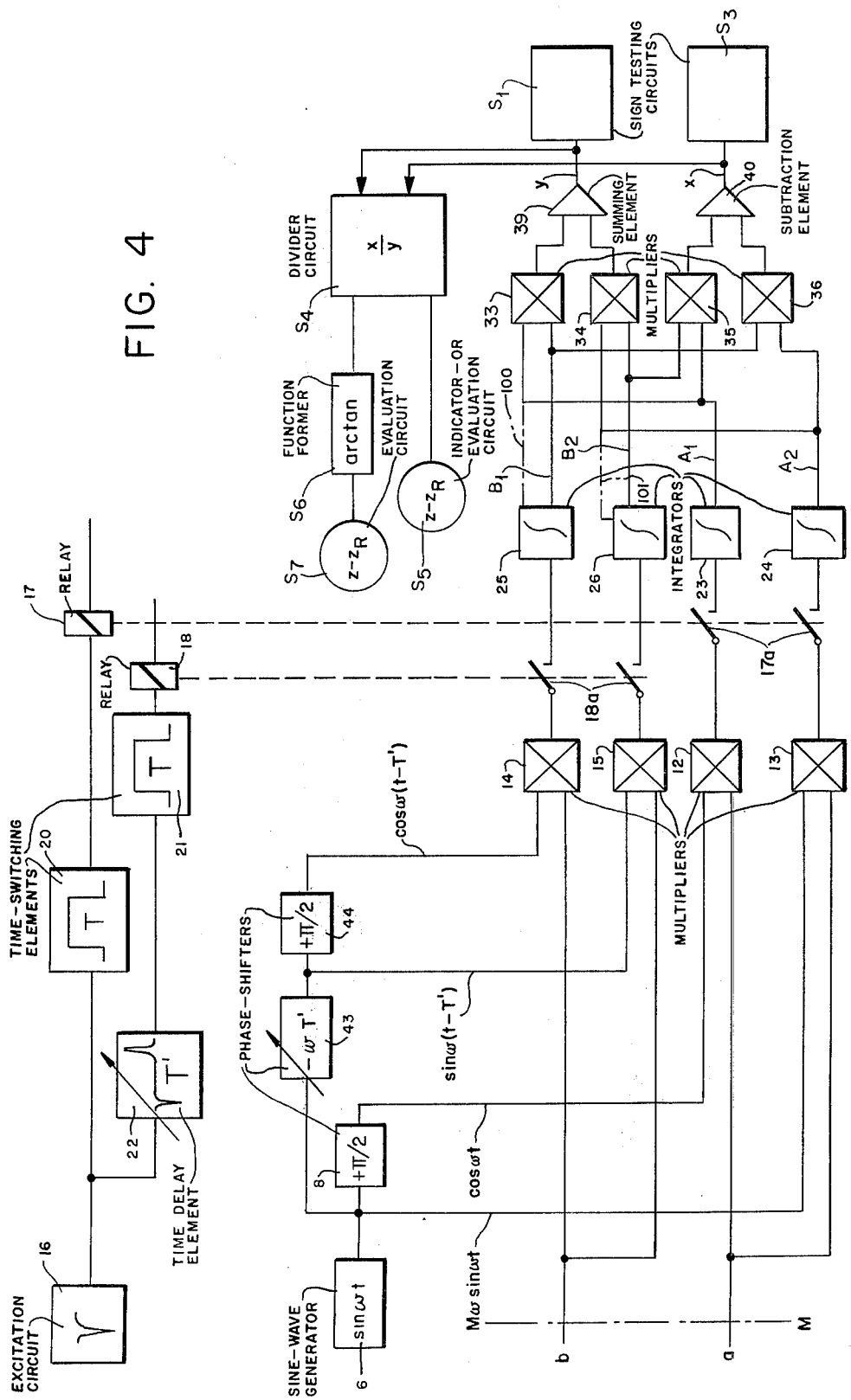
FIG. 4 is an exemplary embodiment of a block circuit diagram for determing the direction of the conductor fault with respect to a single reference location.

FIG. 4 schematically illustrates an exemplary embodiment for carrying out a fault or deflect direction determination with respect to only one reference location. Of course it can be analogously augmented by means of a second data processing channel for a second reference location and an appropriate evaluation circuit. The special features of this embodiment in contrast to that of FIG. 3 resides in the fact that the weighted functions $G_{b1}$ and $G_{b2}$ are formed according to Equations (19) i.e., with a relative shift or displacement between the weighted trigonometric functions and the second wave function $b$ with regard to the phase position of both weighting functions $G_{a1}$ and $G_{a2}$, but however without the previously required linear combination. Accordingly, in the circuit arrangement of FIG. 4 there is connected at the sinusoidal or sine-wave generator 6 parallel to the phase shifting element 8 for generating the cosine function a phase shifter 43 with the adjustable phase shift $\omega T'=\omega 2\alpha z_R$ and a subsequently connected further phase shifting element 44 likewise for generating a cosine function. Thus, there are twice produced both of the complementary trigonometric functions with a mutual phase shift $\omega T'$, as the same is required for Equations (19). This set of weighted trigonometric function signals is then delivered to the multipliers 12, 13, 14, 15 in the manner and for the purposes explained above with respect to the embodiment of circuitry of FIG. 3. The subsequently connected integrators 23 to 26 with the integration interval-switching device including the elements 16, 17, 17a, 18, 18a, and 20 to 22, and the subsequently connected multipliers 33 to 36 as well as the addition or summing amplifier 39 and the substraction amplifier 40 — with the exception of the aforementioned elimination of a linear combination former — correspond to the circuit portion of FIG. 3 for the reference location $z_{R1}$. Accordingly, the circuit elements of FIG. 4 have been conveniently designated with the same reference characters. Also it is to be appreciated that the circuit of FIG. 4 corresponds to that of FIG. 3 as concerns the generation of the wave functions $a$ and $b$, and accordingly, in order to simplify the illustration, the corresponding circuit portion to the left of the broken or phantom line M—M of FIG. 4 has not been illustrated. The sign checking or testing circuit $S_1$ for evaluating the term Y likewise corresponds to the sign testing circuit of FIG. 3, whereas for the evaluation of the term X in accordance with the here considered single reference location there is provided a single sign testing or checking circuit $S_3$.

Apart from the already discussed functionality of the circuitry of FIG. 3, with the exemplary embodiment of circuit arrangement of FIG. 4 there is connected at the outputs of the addition element or amplifier 39 and the subtraction element or amplifier 40, associated with the terms X and Y, a division or divider circuit $S_4$ which forms the tangent term $$\frac{A_1B_2 - A_2B_1}{A_1B_1 + A_2B_2}$$

according to Equation (15). For smaller distances $z-z_R$, as such can be easily maintained in practice, in this case the tangent function lies within a large approximation linear range, so that for the determination of the value $z-z_R$ there can be dispensed with the formation of the inverse trigonometric function according to the entire Equation (15). For the indication or other evaluation, such as for the control of protective devices, there is thus directly connected in circuit an indicator or evaluation circuit $S_5$.

Further, the multipliers 33 and 34 can have the lines 100 and 101 directly connected with a respective output of the integrators 25 and 26, as shown in broken lines in FIG. 4, whereby such multipliers 33 and 34 together with the summing element 39 form a squaring- and addition circuit for forming a square polynomial of the form:

$$B_1^2 + B_2^2$$

from the integral functions $B_1$, $B_2$, and the divider circuit $S_4$ constitutes a quotient former for forming a quotient function of the form:

$$\frac{A_1 \cdot B_2 - A_2 \cdot B_1}{B_1^2 + B_2^2}$$

There also can be connected to the division or divider circuit $S_4$ a conventional analog or digital operating arc-tangent function former $S_6$ provided with a subsequently connected evaluation circuit $S_7$ for a more exact determination of the value $z-z_R$. Moreover, the division or divider circuit $S_4$, owing to the odd character of the tangent function, also delivers the correct sign of $z-z_R$ for the direction determination so that with the last-described quantitive determination of the value $z$ there can be dispensed with the circuit $S_3$.

A particular advantage of all of the illustrated circuit arrangements resides in the fact that a common phase shift of all weighted trignometric function-signals with respect to the wave functions is without influence upon the integration results, and thus there is not necessary any synchronization with respect to the measurement functions, rather only one is required for the trigonometric functions with respect to one another. Therefore, there can be used in both circuits free-running sine-wave generators or oscillators as the common source for the weighted trigonometric function signals.

In practice for high-voltage-current monitoring it has been found advantageous for the selection of the reference frequency to use the network frequency, in other words, for instance 50 Hz or 60 Hz.

Tests with integration times beneath 5msec have produced satisfactory results with sufficient accuracy.

It has been further found that the present defect or fault locating technique is extensively independent of finite defect resistances, especially from arc resistances and arc voltages at the defect or fault location. Furthermore, it is advantageous that the error term becomes small with $z-z_R$, so that especially for faults close to the reference location or at the end of a conductor or line or at the measurement location, there can be still expected relatively satisfactory results in contrast to the state-of-the-art methods.

Figure 5:
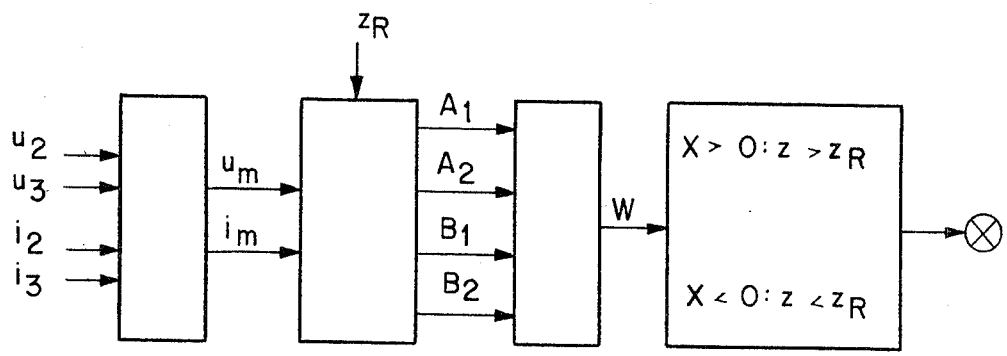
FIG. 5 is an exemplary embodiment of a block circuit diagram for the location of a fault at a polyphase conductor system.

Furthermore, the method of this invention is also suitable for localizing faults or defects in polyphase conductor systems. For a three-phase system with interlinked conductor short-circuit there is illustrated a schematic arrangement in FIG. 5. From the direct measurement voltages $u_2$, $u_3$, i.e., the phase voltages of the affected conductors, and the measurement currents $i_2$, $i_3$ of the affected conductors, there can be derived as follows the input voltage $u_m$ and input current $i_m$ of a circuit according to FIG. 3 or FIG. 4:

Equations (28)

$$u_m = (u_2 - u_3)/\sqrt{3}, \quad i_m = (i_2 - i_3)/\sqrt{3}.$$

Following such the method proceeds just as in the case of a unipolar conductor.

The conditions are more complicated in the case of a ground short in, for instance, a three-phase system. In this case there must be initially determined the standard wave travel times $\alpha_0$, $\alpha_\alpha$ and $\alpha_\beta$, determined by the interlinked conductor impedances per unit length for the zero sequence system, the positive sequence system and the negative sequence system, corresponding to the symmetrical components, and the corresponding ding surge or characteristic impedances $R_w^0$, $R_w^\alpha$, $R_w^\beta$. To this end there are valid the following functions:

Equations (29)

$$\alpha_0 = \sqrt{(l_0 + 2l_1)(c_0 + 2c_1)},$$

$$R_w^0 = \sqrt{\frac{l_0 + 2l_1}{c_0 + 2c_1}},$$

$$\alpha_\alpha = \alpha_\beta = \sqrt{(l_0 - l_1)(c_0 - c_1)},$$

$$R_w^\alpha = R_w^\beta = \sqrt{\frac{l_0 - l_1}{c_0 - c_1}}.$$

In this case for a symmetrical conductor system $l_0$, $l_1$, $c_0$, $c_1$ the inductive and capacitive values of the conductor or line per unit length are defined by the capacitance and inductance values of the conductor with respect to ground or with respect to a neighboring conductor.

Instead of the single measurement voltage and the single measurement current now there is present the three-phase voltage vector and current vector respectively, (phase voltages and phase currents):

Equations (30)

$$u(x,t) = \begin{bmatrix} u_1(x,t) \\ u_2(x,t) \\ u_3(x,t) \end{bmatrix} \qquad i(x,t) = \begin{bmatrix} i_1(x,t) \\ i_2(x,t) \\ i_3(x,t) \end{bmatrix}$$

with the phase voltages $u_1$, $u_2$, $u_3$ and the phase currents $i_1$, $i_2$, $i_3$. For localizing a short-circuit there is formed for the phase voltage $u_1$ according to FIG. 6 the functions $u_o$, $u_\alpha$, $i_o$ and $i_\alpha$, wherein the following are valid:

EQUATIONS (31)

$$u_0 = (u_1 + u_2 + u_3)/3, \quad u_\alpha = (2u_1 - u_2 - u_3)/3,$$

$$i_0 = (i_1 + i_2 + i_3)/3, \quad i_\alpha = (2i_1 - i_2 - i_3)/3.$$

The quantities indicated by the symbol 0 here constitute the null or zero components, those indicated by the symbol $\alpha$ the components of the positive sequence system.

Figure 6:
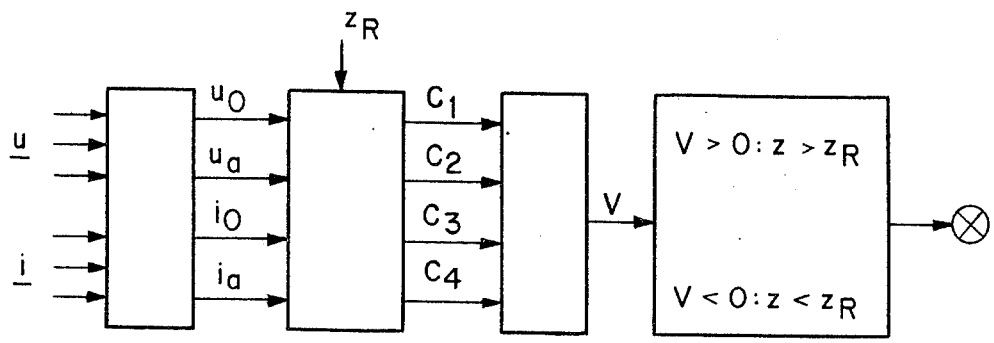
FIG. 6 is an exemplary embodiment of a block circuit diagram for the location of defect or fault and its direction with respect to a reference location of a polyphase conductor system.

In the arrangement of FIG. 6 there are then formed the following magnitudes analogous to the single-phase method:

EQUATIONS (32)

$$c_1 = B_0^1 + B_\alpha^{\ 1} + A_0^1 \cdot 30\ A_\alpha^{\ 1},$$

$$c_2 = B_0^2 + B_\alpha^{\ 2} + A_0^2 + A_\alpha^{\ 2},$$

$$c_3 = B_0^2 + B_\alpha^{\ 2} \cdot K + A_\alpha^{\ 2} \cdot g,$$

$$c_4 = B_0^1 + B_\alpha^{\ 1} \cdot K + A_\alpha^{\ 1} \cdot g,$$

$$A_0^1 = \int_0^T \cos \omega t\, a_0(t) dt,$$

$$A_0^2 = \int_0^T \sin \omega t\, a_0(t) dt,$$

$$B_0^1 = \int_0^T \cos \omega t\, b_0(t + 2\alpha_0 z_R) dt,$$

$$B_0^2 = \int_0^T \sin \omega t\, b_0(t + 2\alpha_0 z_R) dt,$$

$$A_\alpha^{\ 1} = \int_0^T \cos \omega t\, a_\alpha(t + (\alpha_0 - \alpha_\alpha) z_R) dt,$$

$$A_\alpha^{\ 2} = \int_0^T \sin \omega t\, a_\alpha(t + (\alpha_0 - \alpha_\alpha) z_R) dt,$$

$$B_\alpha^{\ 1} = \int_0^T \cos \omega t\, b_\alpha(t + (\alpha_0 + \alpha_\alpha) z_R) dt,$$

$$B_\alpha^{\ 2} = \int_0^T \sin \omega t\, b_\alpha(t + (\alpha_0 + \alpha_\alpha) z_R) dt,$$

with $$a_0(t) = u_0(0,t) + R_w{}^0 i_0(0,t),$$

$$b_0(t) = u_0(0,t) - R_w{}^0 i_0(0,t),$$

$$a_\alpha(t) = u_\alpha(0,t) + R_w{}^\alpha i_\alpha(0,t),$$

$$b_\alpha(t) = u_\alpha(0,t) - R_w{}^\alpha i_\alpha(0,t),$$

$$K = \frac{\alpha_0 + \alpha_\alpha}{2\alpha_0}, \qquad g = \frac{\alpha_0 - \alpha_\alpha}{2\alpha_0},$$

and finally, the criterium magnitude analogous to the term X and expressed by the following:

EQUATION (33)

$$v = c_2 c_4 - c_1 c_3,$$

the sign of which determines the position of the fault or defect location to the one or other side of the reference location.

The previous derivations are strictly valid only for loss-free conductors, i.e., real wave resistance. It has however been found that also for conventional conductors associated with dissipation losses the same method can be employed with sufficient accuracy and reliability.

While there is shown and described present preferred embodiments of the invention, it is to be distinctly understood that the invention is not limited thereto, but may be otherwise variously embodied and practiced within the scope of the following claims. ACCORDINGLY,

What is claimed is:

1. A method of detecting a fault location at a monitored electrical conductor from measurement voltages and measurement currents received at a measurement location following an error-indicating excitation signal, comprising the steps of:
    a. forming a signal representative of a wave voltage by multiplying a signal representing the measurement current by a value representing essentially the characteristic impedance of the conductor;
    b. forming a signal representing a first wave function by adding the wave voltage signal to the measurement voltage signal;
    c. forming a signal representing a second wave function by substracting the wave voltage signal from the measurement voltage signal;
    d. forming signals representing weighted functions by multiplication of:
        i. the first wave function signal with an approximately cosine-type signal of a predetermined reference frequency,
        ii. the first wave function signal with an approximately sine-type signal of a predetermined reference frequency,
        iii. the second wave function signal with an approximately cosine-type signal of a predetermined reference frequency, and
        iv. the second wave function signal with an approximately sine-type signal of a predetermined reference frequency;
    e. forming signals representing a respective first to fourth integral function by the integration as a function of time of a respective one of the weighted function signals over an integration interval of substantially given duration, which begins following the error-indicating excitation, and possesses a time-shift for the weighted function signals obtained from the second wave function signal with respect to the weighted function signals obtained from the first wave function signal which corresponds to an integral multiple of the wave travel time between the measurement location and a predetermined reference location, and wherein there is carried out:
  i. either a time shift substantially corresponding to the product of the integration interval shift and the reference frequency in a sense opposite to the latter for the cosine-type and sine-type signals within the weighted functions obtained from the second wave function signal,
  ii. or without such a time-shift a linear combination of the integral functions obtained from the second wave function signal with cosine and sine values of an angle argument substantially corresponding to the product of the integration time-shift and the reference frequency;
 f. selectively forming a signal representing either:
  i. the product difference from those integral functions formed by cosine andd sine weighting, respectively, of the first and second wave functions and integration, or
  ii. the product sum from those integral functions formed by cosine weighting of the first and second wave functions or sine weighting of the first and second wave functions, respectively, or
  iii. both such product difference and product sum; and
 g. checking the sign of at least one of such product polynominal signals of step (f).

2. The method as defined in claim 1, including the step of forming a first product signal from the integral function signals obtained by cosine weighting of the first wave function and sine weighting of the second wave function and integration, and forming a second product signal from the integral function signals obtained by sine weighting of the first wave function and cosine weighting of the second wave function and integration, and forming the difference of such product signals.

3. The method as defined in claim 2, including the step of forming the product signal difference for two different reference location coordinates of two different reference locations, and checking the equality of the sign of both such product signal differences.

4. The method as defined in claim 3, including the step of selecting a first reference location of said two different reference locations so as to be located at the measurement location and a second reference location of said different reference locations so as to be located at the end of a section of the conductor which is monitored.

5. The method as defined in claim 3, including the step of forming a third product signal from the integral function signals obtained by cosine weighting of the first wave function and the second wave function and integration, and forming a fourth product signal from the integral function signals obtained by sine weighting of the first wave function and the second wave function and integration, and forming the sum of such product signals and the quotient of the product signal difference and the product signal sum.

6. The method as defined in claim 3, including the step of forming a signal constituting the square of the integral function obtained by cosine weighting of the second wave function and integration, and forming a signal constituting the square of the integral function obtained by sine weighting of the second wave function and integration, and forming signals corresponding to the sum of such square signals and the quotient of the product signal difference and the sum of the square signals.

7. The method as defined in claim 6, including the step of forming a signal corresponding to the arc-tangent function from the obtained quotient signals.

8. The method as defined in claim 6, including the step of forming a signal corresponding to the arc-sine function from the obtained quotient signals.

9. The method as defined in claim 1, including the step of setting as the reference frequency a prevailing frequency component of the second wave function.

10. The method as defined in claim 1, including the step of determining the position of an interlinked short-circuit in a three-phase conductor system by forming from phase measurement voltages ($u_2$, $u_3$) and phase measurement currents ($i_2$, $i_3$) of the affected conductors an input voltage signal ($u_m$) and an input current signal ($i_m$) defined by the following equations:
$$u_m = (u_2 - u_3)/\sqrt{3}, \quad i_m = (i_2 - i_3)/\sqrt{3},$$

in order to produce during subsequent processing of such input voltage and input signals respective signals representative of a first wave function and a second wave function.

11. The method as defined in claim 1, wherein in order to determine the position of ground-shorts in a three-phase conductor system there is formed from all phase-measurement voltages and phase-measurement currents a respective pair of input voltage signals for two symmetrical components of the system, and employing the thus formed pair of input voltage signals for forming signals representative of two corresponding pairs of first and second wave functions and for a double-channel formation of integral function signals for an evaluation function of the form $$v = c_2 \cdot c_4 - c_1 \cdot c_3$$

wherein $C_1$, $C_2$, $C_3$, $C_4$ represent the integral functions.

12. An apparatus for detecting a fault location at an electrical conductor for measurement voltages and measurement currents received at the measurement location following an error-indicating excitation signal, comprising, the combination of:
 a. an excitation circuit having an error-indicating excitation signal as the output;
 b. measurement elements for the measurement of a measurement voltage and measurement current at a predetermined measurement location;
 c. a multiplier connected in circuit with the measuring element for measurement of the measurement current for forming a signal representative of the product of the characteristic impedance of the conductor and the measurement current;
 d. an additional and subtraction circuit connected in circuit with said multiplier and having two outputs, a first output thereof carrying a signal substantially corresponding to a first wave function and a second output thereof carrying a signal substantially corresponding to a second wave function;
 e. a multiplier device provided with inputs for at least one signal which is substantially sinusoidal as a function of time and for the signals corresponding to the first and second wave functions, said multiplier device having outputs at which there appear signals representative of four weighted functions in the form of the products of the first wave function and two substantially sinusoidal-type signals and the second wave function and two substantially sinusoidal-type signals;

f. an integration device having inputs for receiving said signals representative of the four weighting functions;

g. a switching device connected in circuit with said multiplier device and said integration device for determining the duration coinciding with integration intervals for said four weighted functions as the integrands;

h. said integration device having four integral signal outputs, each of said integral signal outputs carrying a signal substantially corresponding to one of four integral functions, each integral function being associated with the time integral of one of the weighted functions;

i. a multiplication and subtraction device for forming an evaluation function of the form:

$$A_1 \cdot B_2 - A_2 \cdot B_1$$

wherein $A_1$, $A_2$, $B_1$, $B_2$ represent the respective four integral functions; and j. a sign testing circuit connected in circuit with said multiplication and subtraction device for delivering an output signal representative of the direction of the position of the fault location with respect to a reference location.

13. The apparatus as defined in claim 12, including two data processing channels for forming a respective evaluation function of the form:

$$A_1 \cdot B_2 - A_2 \cdot B_1$$

for each of two reference locations, a sign comparison circuit with which there is connectd said data processing channels, said sign comparison circuit delivering an output signal in the form of a decision signal for the determination of the position of the fault location interior of or exterior of a section of the conductor bounded by both reference locations.

14. The apparatus as defined in claim 12, further including a multiplication and addition circuit for forming a product polynomial of the form:

$$A_1 \cdot B_1 + A_2 \cdot B_2$$

and a quotient former for forming a quotient function of the form:

$$\frac{A_1 \cdot B_2 - A_2 \cdot B_1}{A_1 \cdot B_1 + A_2 \cdot B_2}.$$

15. The apparatus as defined in claim 12, further including a squaring and addition circuit for forming a square polynomial of the form:

$$B_1^2 + B_2^2$$

and a quotient former for forming a quotient function of the form:

$$\frac{A_1 \cdot B_2 - A_2 \cdot B_1}{B_1^2 + B_2^2}.$$

16. The apparatus as defined in claim 12, further including a common sine-wave generator which is non-synchronized with respect to the wave function signals for forming all complementary signals which are sinusoidal as a function of time in order to form the weighted function signals.

17. The apparatus as defined in claim 12, wherein the multiplier device for forming the weighted function signals has an input side at which there is applied apart from the signals representing the wave functions four trigonometric function signals which are complementary in pairs and coincide in phase, and wherein there is connected in circuit with those outputs of the integration device carrying the integral function signals associated with the second wave function a linear combination former for producing a linear combination from signals representing the second and third integral functions and fixed trigonometric function values substantially corresponding to the sine product and cosine product, respectively, of the reference and an integral multiple of the wave travel time between the measurement location and reference location.

18. The apparatus as defined in claim 12, wherein the multiplier device has applied in pairs to its input side for forming the weighted functions two complementary trigonometric function signals together with the first wave function signal in a first relative time-position and in pairs two complementary trigonometric function signals together with the second wave function signal in a second relative time-position, and wherein the difference between the first relative time-position and the second relative time-position amounts to an integral multiple of the wave travel time between the measurement location and the reference location.

* * * * *